(12) United States Patent
Raksha et al.

(10) Patent No.: US 12,359,072 B2
(45) Date of Patent: Jul. 15, 2025

(54) PIGMENT INCLUDING AN INTERMETALLIC COMPOUND

(71) Applicant: VIAVI SOLUTIONS INC., San Jose, CA (US)

(72) Inventors: Vladimir P. Raksha, Santa Rosa, CA (US); Cornelis Jan Delst, Fairfax, CA (US); Paul Thomas Kohlmann, Windsor, CA (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

(21) Appl. No.: 17/192,553

(22) Filed: Mar. 4, 2021

(65) Prior Publication Data

US 2022/0282094 A1 Sep. 8, 2022

(51) Int. Cl.
*C09C 1/36* (2006.01)
*C23C 14/24* (2006.01)

(52) U.S. Cl.
CPC ............... *C09C 1/36* (2013.01); *C23C 14/24* (2013.01)

(58) Field of Classification Search
CPC ....... C09C 1/36; C09C 2220/20; C09C 1/006; C09C 1/0033; C09C 1/62; C09C 1/64; C23C 14/24
See application file for complete search history.

(56) References Cited

U.S. PATENT DOCUMENTS

| | | | |
|---|---|---|---|
| 3,926,659 A | 12/1975 | Bernhard et al. |
| 4,838,648 A | 6/1989 | Phillips et al. |
| 5,006,419 A | 4/1991 | Grunke et al. |
| 5,214,530 A | 5/1993 | Coombs et al. |
| 5,223,360 A | 6/1993 | Prengel et al. |
| 5,383,995 A | 1/1995 | Phillips et al. |
| 5,569,535 A | 10/1996 | Phillips et al. |
| 6,589,331 B2 | 7/2003 | Ostertag et al. |
| 6,759,097 B2 | 7/2004 | Phillips et al. |
| 6,808,806 B2 | 10/2004 | Phillips et al. |
| 6,818,299 B2 | 11/2004 | Phillips et al. |
| 6,838,166 B2 | 1/2005 | Phillips et al. |
| 6,875,522 B2 | 4/2005 | Seto et al. |

(Continued)

FOREIGN PATENT DOCUMENTS

| | | |
|---|---|---|
| CN | 1459034 A | 11/2003 |
| CN | 105452392 A | 3/2016 |

(Continued)

OTHER PUBLICATIONS

TranslationJPH10-168339 (Year: 1998).*

(Continued)

*Primary Examiner* — Colin W. Slifka
(74) *Attorney, Agent, or Firm* — Mannava & Kang, P.C.

(57) ABSTRACT

A pigment, including a magnetizable reflector layer including an intermetallic compound, wherein the intermetallic compound is a crystal structure of at least two different elemental metals chemically bonded together is disclosed. A pigment, including a semi-transparent absorber layer including an intermetallic compound, wherein the intermetallic compound is a crystal structure of at least two different elemental metals chemically bonded together is disclosed. A method of making the pigment is also disclosed.

13 Claims, 6 Drawing Sheets

(56) References Cited

U.S. PATENT DOCUMENTS

| | | | |
|---|---|---|---|
| 6,902,807 B1* | 6/2005 | Argoitia | B42D 25/29 |
| | | | 428/323 |
| 9,482,800 B2 | 11/2016 | Markantes et al. | |
| 9,508,475 B2 | 11/2016 | Raksha et al. | |
| 10,031,269 B2 | 7/2018 | Markantes et al. | |
| 2002/0160194 A1 | 10/2002 | Phillips et al. | |
| 2003/0207112 A1* | 11/2003 | Yadav | B01J 19/24 |
| | | | 106/400 |
| 2004/0166308 A1* | 8/2004 | Raksha | C09C 1/0024 |
| | | | 428/329 |
| 2011/0048276 A1 | 3/2011 | Schlegl et al. | |
| 2013/0257035 A1 | 10/2013 | Shimizu et al. | |

FOREIGN PATENT DOCUMENTS

| | | | | |
|---|---|---|---|---|
| DE | 10000592 | A1 | 10/2000 | |
| DE | 10065761 | A1 | 7/2002 | |
| DE | 10114445 | A1 | 9/2002 | |
| DE | 10114446 | A1 | 9/2002 | |
| EP | 686675 | B1 | 2/1998 | |
| EP | 1144711 | A1 | 10/2001 | |
| EP | 1878773 | A2 | 1/2008 | |
| EP | 1918334 | A2 | 5/2008 | |
| EP | 2351797 | A1 | 8/2011 | |
| EP | 2402401 | A1 | 1/2012 | |
| EP | 2285910 | B1 | 1/2017 | |
| EP | 3421551 | A1 * | 1/2019 | C09C 1/0015 |
| JP | H10168839 | A * | 6/1998 | |
| WO | WO-0109884 | A1 * | 2/2001 | B82Y 10/00 |
| WO | WO-0240599 | A1 * | 5/2002 | B82Y 10/00 |
| WO | 2002073250 | A2 | 9/2002 | |
| WO | 2003000801 | A2 | 1/2003 | |
| WO | 2007115212 | A1 | 10/2007 | |
| WO | 2007131833 | A1 | 11/2007 | |
| WO | WO-2008018747 | A1 * | 2/2008 | C08K 3/08 |
| WO | 2008156948 | A2 | 12/2008 | |
| WO | 2009091479 | A2 | 7/2009 | |
| WO | 2012084097 | A1 | 6/2012 | |

OTHER PUBLICATIONS

Wikipedia, "Duralumin", downloaded from the Internet on Oct. 17, 2023, 4 pages.https://en.wikipedia.org/w/index.php?title=Duralumin&oldid=1171157840.

Wikipedia, "Sendust", downloaded from the Internet on Oct. 17, 2023, 1 page.https://en.wikipedia.org/w/index.php?title=Sendust&oldid=1174306711.

"Toxicological Profile for Nickel", U.S. Department of Health and Human Services, Aug. 2005, 397 pages.

Jorma Ryhanen, "Biocompatibility Evaluation of Nickeltitanium Shape Memory Metal Alloy", Academic Dissertation, University of Oulu, May 7, 1999, 119 pages.

Roy J. Irwin et al., "Environmental Contaminants Encyclopedia", Jul. 1, 1997, 109 pages.

The Materials Project, "Materials Explorer, Ti mp-46", downloaded from the Internet on Dec. 17, 2024, 7 pages. <https://next-gen.materialsproject.org/materials/mp-46/>.

The Materials Project, "Materials Explorer, Ti2Ni mp-1808", downloaded from the Internet on Dec. 17, 2024, 6 pages. <https://next-gen.materialsproject.org/materials/mp-1808/>.

The Materials Project, "Materials Explorer, TiNi mp-571", downloaded from the Internet on Dec. 17, 2024, 6 pages. <https://next-gen.materialsproject.org/materials/mp-571/>.

The Materials Project, "Materials Explorer, TiNi3 mp-1409", downloaded from the Internet on Dec. 17, 2024, 6 pages. <https://next-gen.materialsproject.org/materials/mp-1409/>.

U.S. EPA "Methods to Develop Inhalation Cancer Risk Estimates for Chromium and Nickel Compounds", EPA-452/R-11-012, Oct. 2011, 19 pages.

Wendy Z. Teo et al., "Metal Hypersensitivity Reactions to Orthopedic Implants", Dec. 19, 2016, 12 pages.

"Material Science Basis", WANG Shunhua, et al., Southwest Jiaotong University Press, pp. 66-67, Jan. 2011.

"Multi-arc ion plating of a Ti Al Zr Cr N-based composite hard film", Zhao Shilu, Metallurgical Industry Press, pp. 18 and 19, Feb. 2013.

* cited by examiner

PIGMENT INCLUDING AN INTERMETALLIC COMPOUND

FIELD OF THE INVENTION

The present disclosure generally relates to a pigment, including a magnetizable reflector layer including an intermetallic compound, wherein the intermetallic compound is a crystal structure of at least two different elemental metals chemically bonded together. Additionally, the disclosure relates to a pigment, including: a semi-transparent absorber layer including an intermetallic compound, wherein the intermetallic compound is a crystal structure of at least two different elemental metals chemically bonded together. A method of making the article and the semi-transparent magnetic pigment is disclosed.

BACKGROUND OF THE INVENTION

Alloys can be classified as solution alloys or heterogeneous alloys. Solution alloys are homogeneous mixtures in which the components are dispersed randomly and uniformly. The primary metal is called the base, the matrix, or the solvent. The secondary constituents are often called solutes. Atoms of the solute can take positions usually occupied by a solvent atom, thereby forming a substitutional alloy, or they can occupy interstitial positions, thus creating an interstitial alloy. Substitutional alloys in FIG. 1Aa are formed when the two metallic components have similar atomic radii and chemical-bonding characteristics. For example, silver and gold form such an alloy over the entire range of possible compositions. For an interstitial alloy (FIG. 1B), the component present in the interstitial positions between the solvent atoms must have a much smaller covalent radius than the solvent atoms. Typically, an interstitial element is a nonmetal that participates in bonding to neighboring atoms.

In heterogeneous alloys, the components are not dispersed uniformly. For example, in the form of steel known as pearlite, pure iron, and cementite $Fe_3C$ are present in alternating layers. In general, the properties of heterogeneous alloys depend not only on the composition but also on the manner in which the solid is formed from the molten mixture.

Interference pigments can contain a layer of magnetic material between two reflector layers, such as two aluminum layers. An exemplary structure is: $Cr/MgF_2/Al/M/Al/MgF_2/Cr$, wherein M is Ni, Fe, Co, etc. The seven-layer structure is more expensive to make as compared to a five-layer structure.

Pigments have been made with materials, which at the time appeared to be environmentally safe and/or non-harmful. However, as environmental awareness increases over time, it appears that some materials, such as chromium converted hexavalent compounds, or nickel, may cause environmental problems, including issues with waste disposal, etc. Additionally, the materials may not be chemically stable upon exposure to wet, acidic, or alkaline environments. The use of these materials can add manufacturing costs to the pigment related to safety protocols. Moreover, the use of these material can limit the use of the pigments, for example, to uses where the environmental issues are de minimis or can be controlled.

What is needed is a replacement for materials used in pigments, in which the replacement materials do not appear to include the environmental problems. The use of the replacement materials would therefore result in a cheaper, safer pigment. Additionally, a pigment with a reduced number of layers, for example, 5 layers instead of 7 layers, would decrease fabrication costs.

BRIEF DESCRIPTION OF THE DRAWINGS

Features of the present disclosure are illustrated by way of example and not limited in the following figure(s), in which like numerals indicate like elements, in which.

SUMMARY OF THE INVENTION

Figure 1A:
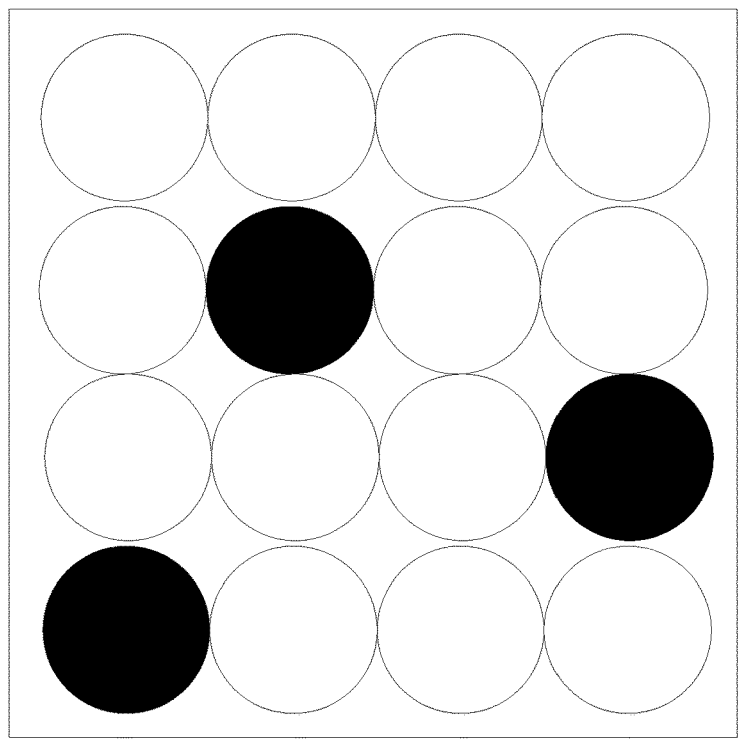
FIG. 1A is a depiction of a solution alloy.

In an aspect, there is disclosed a pigment, comprising: a magnetizable reflector layer including an intermetallic compound, wherein the intermetallic compound is a crystal structure of at least two different elemental metals chemically bonded together.

In another aspect, there is disclosed a pigment, comprising: a semi-transparent absorber layer including an intermetallic compound, wherein the intermetallic compound is a crystal structure of at least two different elemental metals chemically bonded together.

In another aspect, there is also disclosed method of making a pigment, comprising: depositing, onto a substrate, a layer including an intermetallic compound by thermal evaporation in vacuum or co-evaporation, wherein the intermetallic compound is a crystal structure of at least two different elemental metals chemically bonded together.

Additional features and advantages of various embodiments will be set forth, in part, in the description that follows, and will, in part, be apparent from the description, or can be learned by the practice of various embodiments. The objectives and other advantages of various embodiments will be realized and attained by means of the elements and combinations particularly pointed out in the description herein.

DETAILED DESCRIPTION OF THE INVENTION

For simplicity and illustrative purposes, the present disclosure is described by referring to examples thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Additionally, the elements depicted in the accompanying figures may include additional components and some of the components described in those figures may be removed and/or modified without departing from scopes of the present disclosure. Further, the elements depicted in the figures may not be drawn to scale and thus, the elements may have sizes and/or configurations that differ from those shown in the figures.

It is to be understood that both the foregoing general description and the following detailed description are exemplary and explanatory only, and are intended to provide an explanation of various embodiments of the present teachings. In its broad and varied embodiments, disclosed herein are pigments, compositions including the pigments, articles including the compositions; and methods of making and using the pigments, compositions, and articles. The pigments can be used in non-security and security applications. In an aspect, the pigment is a security pigment.

The pigment can include a magnetizable reflector layer including an intermetallic compound. The pigment can a semi-transparent absorber layer including an intermetallic compound.

The intermetallic compound is a crystal structure of at least two different elemental metals chemically bonded together. In particular, an intermetallic compound is a class of substances including definite proportions of two or more chemically bonded elemental metals with its own characteristic crystal structure, and a definite chemical compound. In an aspect, the intermetallic compound can include definite proportions of a metal and a nonmetal, such as an alloy, chemically bonded together and having a crystalline structure. The intermetallic compound does not have a continuously variable proportion, as in solid solutions.

Figure 1B:
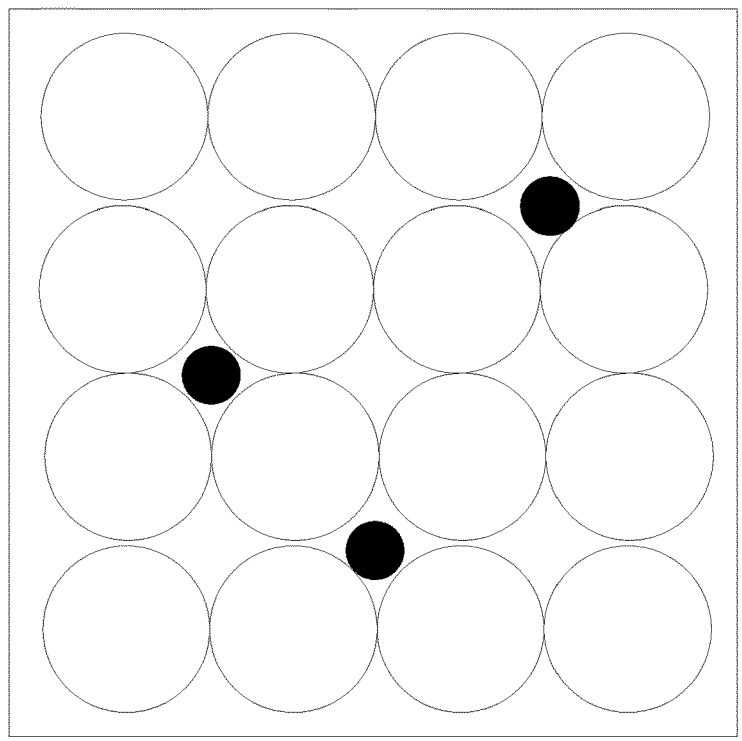
FIG. 1B is a depiction of an interstitial alloy.
Figure 2:
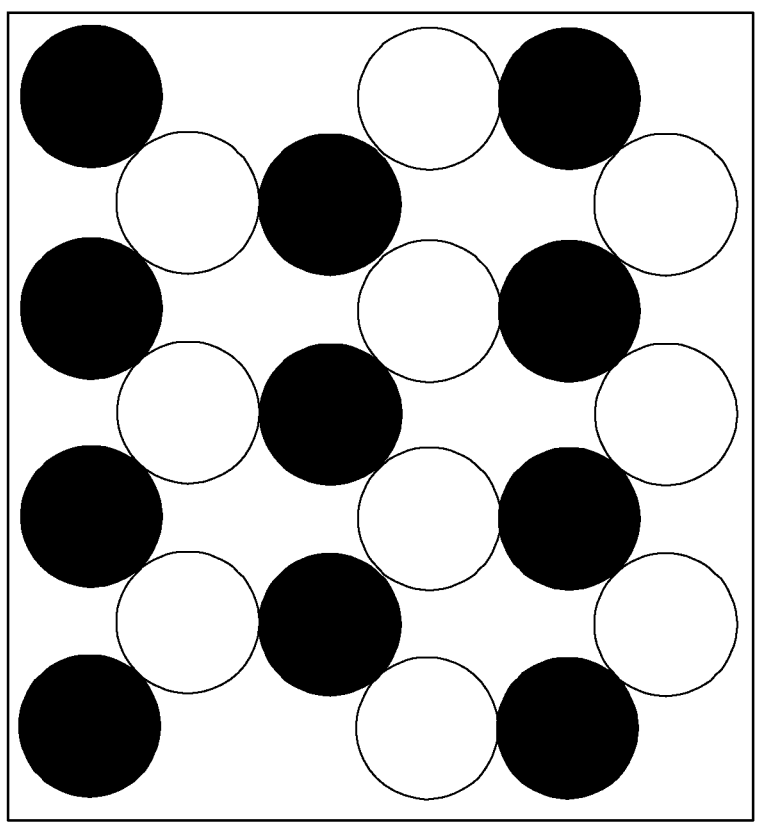
FIG. 2 is a depiction of an intermetallic compound.
Figure 3:
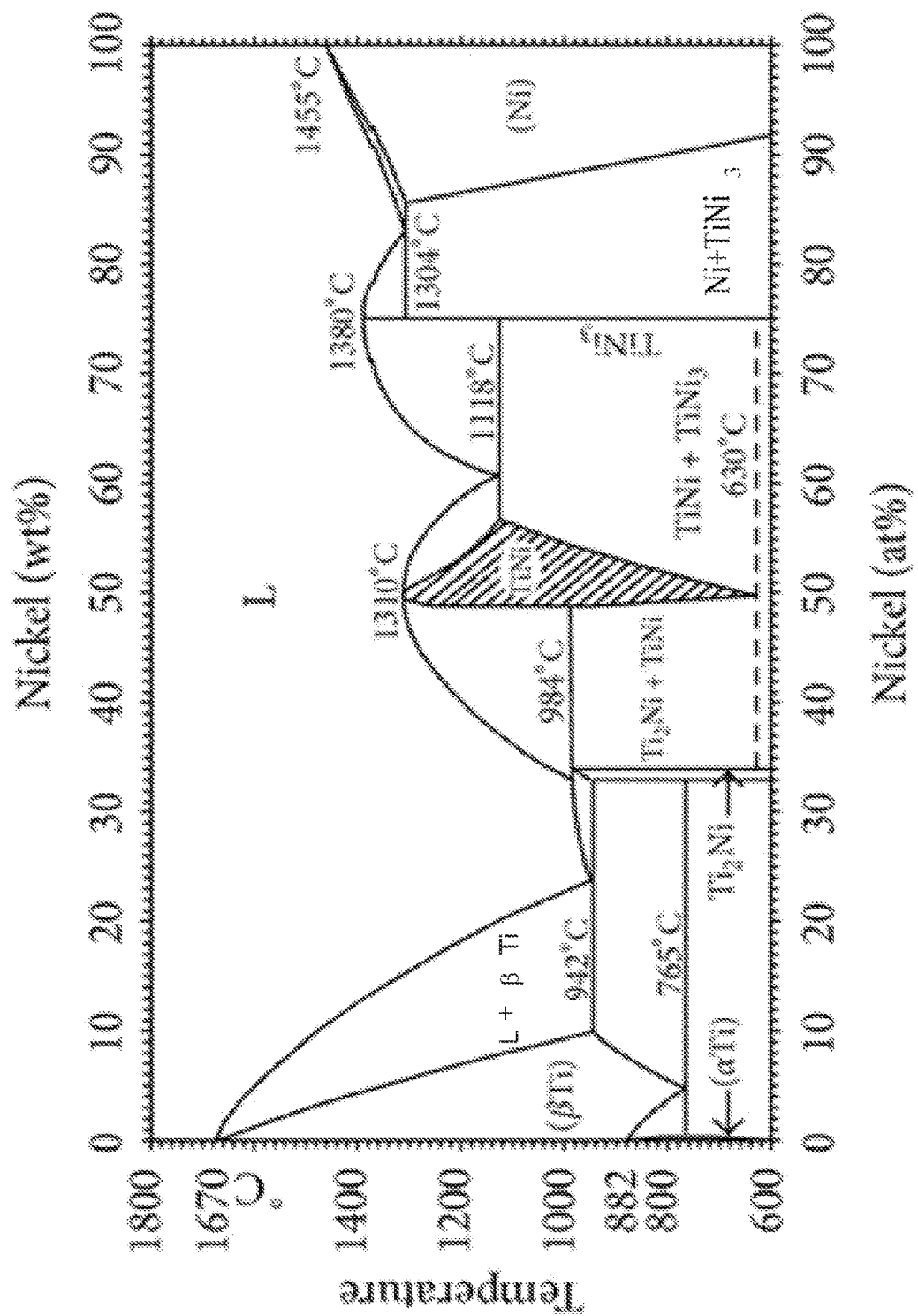
FIG. 3 is a binary Ti—Ni phase diagram.

As shown in FIG. 2, the position of the elemental metals is ordered and not random, which differentiates the intermetallic compound from a "common" alloy (FIGS. 1A and 1B). Intermetallic compounds with defined stoichiometry have their own crystalline structures. The crystalline structures of intermetallic compounds are entirely different than the structures of solid solutions (alloys) of the same constituted metals. The difference between metals, their alloys, and intermetallic compounds is illustrated with titanium and nickel as an example. The binary Ti—Ni phase diagram is given in FIG. 3.

Titanium exists in two allotropic forms. At low temperatures, the so-called alpha phase αTi (with hexagonal compact crystalline structure) is presented, and the beta phase βTi (with body-centered cubic crystalline structure) emerges above 883° C. The binary phase diagram shows that βTi alloys exist above 765° C. in the concentration range of 90-100 at % of Ti. The αTi is a low-temperature phase. The region L of the liquid phase on the diagram in FIG. 3 corresponds to solutions of nickel and titanium in all concentrations range. The (L+βTi) region describes the mix of the liquid phase and the solid beta phase. In contrast to titanium, nickel doesn't have allotropic forms at different temperatures. It crystallizes in the cubic crystal system in the Ni region on the phase diagram.

Besides the areas of titanium and nickel, there are three intermetallic compounds on the phase diagram. They are titanium nickelades $Ti_2Ni$, $TiNi$, and $TiNi_3$. Crystalline structures, melting points, and properties of solid titanium nickelades are demonstrated in Table 1.

TABLE 1

Properties of solid titanium nickelades.

| Component | Melting Point, ° C. | Crystal system | Lattice parameters, Å | | | Magnetism | Toughness |
| --- | --- | --- | --- | --- | --- | --- | --- |
| | | | a | b | c | | |
| Ti | 1670 | hexagonal | 2.939 | 2.939 | 4.641 | N/M | Tough |
| Ni | 1455 | cubic | 2.481 | 2.481 | 2.481 | M | Tough |
| $Ti_2Ni$ | 984 | face-centered cubic | 7.974 | 7.974 | 7.974 | N/M | Brittle, fractures at impact |
| TiNi | 1310 | cubic | 3.005 | 3.005 | 3.005 | M | Tough, shape-memory alloy |
| $TiNi_3$ | 1380 | hexagonal | 5.096 | 5.096 | 8.312 | M | Tough |

N/M-non-magnetic
M-magnetic

Comparison of melting points, crystal systems, lattice parameters, and other properties reveals that all components of the binary Ti-Ni phase diagram, demonstrated in Table 1, significantly differ from each other. The crystal structure of each nickelades defines their physical and chemical properties. For example, di-titanium nickelade $Ti_2Ni$ is as brittle as glass at room temperature. In contrast, equiatomic TiNi (also called NITINOL) is hard, electrically conductive, highly corrosion-resistant, and less dense than steel. A characteristic feature of titanium nickel intermetallics is their excellent resistance to oxidation due to the formation of titanium dioxide on the surface of the compound.

Figure 4:
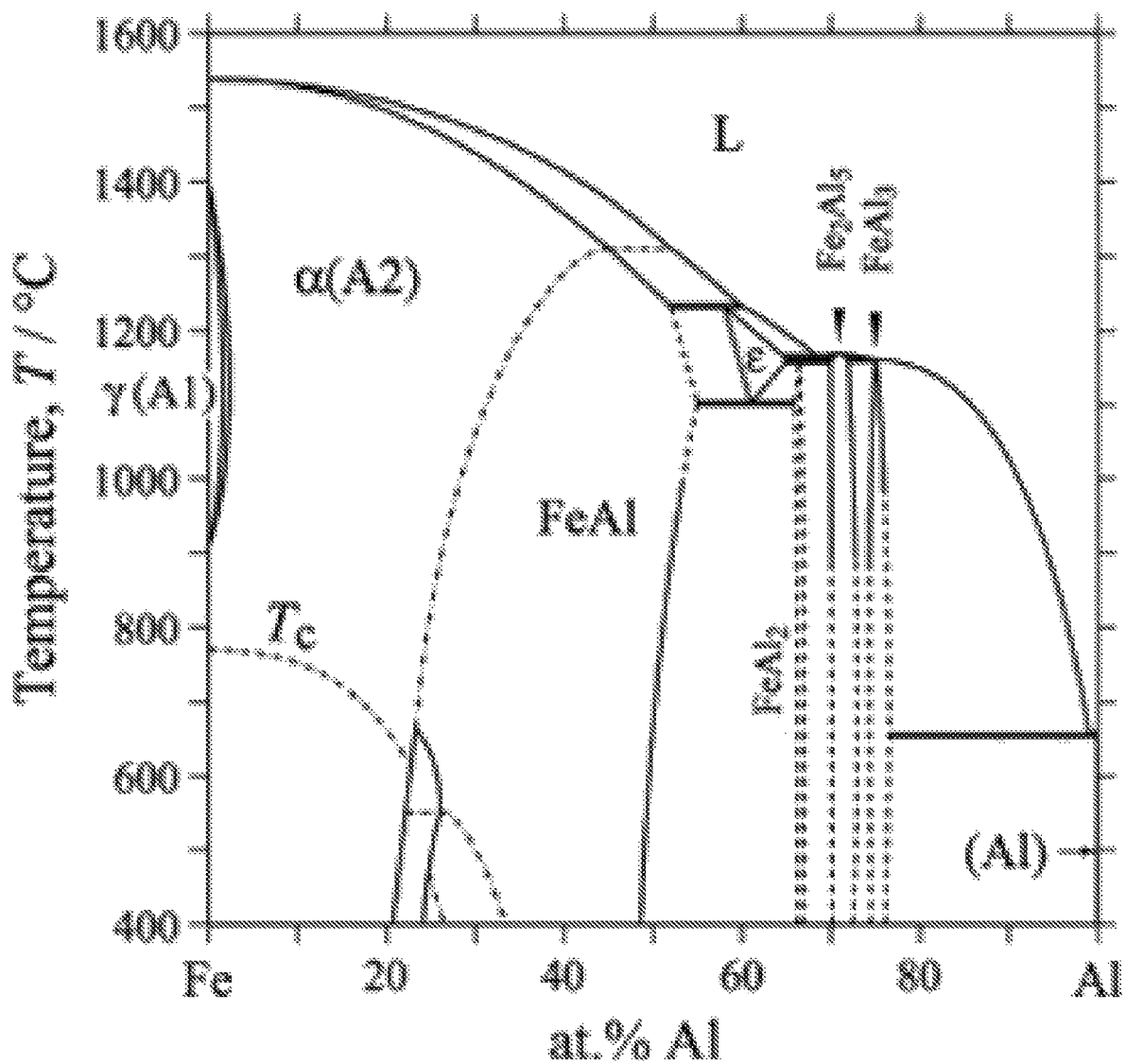
FIG. 4 is a binary Fe—Al phase diagram.

Additionally, the intermetallic compound has a defined stoichiometry. As an example, iron and aluminum can form four different intermetallics with specific chemical composition, as shown in the Fe—Al phase diagram in FIG. 4. The four intermetallics are: $FeAl$, $FeAl_2$, $Fe_2Al_3$, and $FeAl_3$.

Intermetallic compounds can exhibit physical, optical, and chemical properties different from the properties of their constituent metals. Many intermetallic compounds are brittle, chemically resistant to corrosion and have a high melting point. They often offer a compromise between ceramic and metallic properties when hardness and/or resistance to high temperatures are important enough to sacrifice some toughness and ease of processing. They can also display desirable magnetic, superconducting, and chemical properties, due to their strong internal order and mixed (metallic and covalent/ionic) bonding, respectively.

The intermetallic compound can be selected from the group consisting of $CoAs_2$, $NiSb$, $Cu_3As$, duraluminum, $CuAl_2$, $FeCo$, $FeAl$, $Fe_2Al_3$, $FeAl_2$, $FeAl_3$, $Fe_3Al$, $Fe_2Nb$, $FeNb$, $ZrNi$, $Zr_2Ni$, $ZrNi$, $Zr_3Fe$, $TiZn$, $Ti_2Zn$, $TiZn_2$, $TiAl$, $Ti_2Ni$, $TiNi$, $TiNi_3$, $TiCo$, $TiCo_2$, $TbAl$, $Tb_2Al$, $Ni_3Al$, $Cr_3Pt$, $Cr_2Nb$, Alnico, sendust, terfenol-D, $CoAl$, $AlGd$, $AlGd_2$, $Ni_{80}Ti_5Nb_{15}$, $TbPtGa$, $La_2Co_{17-x}Ta_x$ in which x is 0.5 and 0.6, $HoCo_2B_2C$, $GdNi_2B_2C$, $(Y_{1-x}Gd_x)Ni_2B_2C$, $ErCo_2B_2C$, $(Y_{1-x}Gd_x)Ni_2B_2C$, and combinations thereof. The subscripts of x and/or y can each be a number greater than 0 to define stoichiometric amounts of each element.

In an aspect, the intermetallic compound is a two-component binary intermetallic compound, such as $Fe_3Al$, Ni$_3$Al, CoAl, TiNi, Ti$_2$Ni, and FeCo. In an aspect, the intermetallic compound is a three-component ternary intermetallic compound, such as Ni$_{80}$Ti$_5$Nb$_{15}$, TbPtGa, and La$_2$Co$_{17-x}$Ta$_x$ (x=0.5 and 0.6, etc.). In an aspect, the intermetallic compound is a four-component quaternary intermetallic compound, such as HoCo$_2$B$_2$C, GdNi2B2C, (Y$_{1-x}$Gd$_x$)Ni$_2$B$_2$C, and ErCo2B2C. In an aspect, the intermetallic compound is a five-component quinary intermetallic compound, such as Y$_{1-x}$Gd$_x$)Ni$_2$B$_2$C.

The binary intermetallic compounds can be deposited on a substrate by thermal evaporation in vacuum or co-evaporation of constituent metals. The Ternary, quaternary, and quinary intermetallics can be deposited on a substrate by different kinds of magnetron sputtering that make it cost efficient for a mass scale production.

Many of the intermetallics disclosed above can be used in a magnetizable a magnetizable reflector layer. As an example, magnetic intermetallics include Al$_m$Ni$_n$Co$_x$Cu$_y$Ti$_z$ (m=8-12%, n=15-26%, x=5-24%, y=6%, z=up to 1%), Sendust (Fe$_x$Si$_y$Al$_z$, x=85%, y=9% and, z=6%), Terfenol-D (Tb$_x$Dy$_{1-x}$Fe$_2$ (x~0.3)), and Permendur FeCo. In an aspect, the magnetizable reflector layer can include an intermetallic chosen from FezNb, FeNb, TiNi, TiNi$_2$, AlCo, AlGd, AlGd$_2$, TbAl, Tb$_2$Al, TiCo, TiCo$_2$, and other binary intermetallic compounds, where one component is a ferromagnetic material.

The pigment can include a semi-transparent absorber layer including the intermetallic compound disclosed above.

The pigment can also include at least one dielectric layer. The dielectric layer can be formed to have an effective optical thickness for a particular wavelength. The dielectric layer can be optionally clear, or can be selectively absorbing so as to contribute to the color effect of a pigment. The optical thickness is a well-known optical parameter defined as the product $\eta d$, where $\eta$ is the refractive index of the layer and d is the physical thickness of the layer. Typically, the optical thickness of a layer is expressed in terms of a quarter wave optical thickness (QWOT) that is equal to $4\eta rf/\lambda$, where $\lambda$ is the wavelength at which a QWOT condition occurs. The optical thickness of the dielectric layer can range from about 2 QWOT at a design wavelength of about 400 nm to about 9 QWOT at a design wavelength of about 700 nm, and for example about 2-6 QWOT at 400-700 nm, depending upon the color shift desired. The dielectric layer can have a physical thickness of about 100 nm to about 800 nm, and for example from about 140 nm to about 650 nm, depending on the color characteristics desired.

Suitable materials for a dielectric layer include those having a "high" index of refraction, defined herein as greater than about 1.65, as well as those have a "low" index of refraction, which is defined herein as about 1.65 or less. The dielectric layer can be formed of a single material or with a variety of material combinations and configurations. For example, the dielectric layer can be formed of only a low index material or only a high index material, a mixture or multiple sublayers of two or more low index materials, a mixture or multiple sublayers of two or more high index materials, or a mixture or multiple sublayers of low index and high index materials. In addition, the dielectric layer can be formed partially or entirely of high/low dielectric optical stacks. When a dielectric layer is formed partially with a dielectric optical stack, the remaining portion of the dielectric layer can be formed with a single material or various material combinations and configurations as described above.

Non-limiting examples of suitable high refractive index materials for the dielectric layer include zinc sulfide (ZnS), zinc oxide (ZnO), zirconium oxide (ZrO$_2$), titanium dioxide (TiO$_2$), diamond-like carbon, indium oxide (InO$_3$), indium-tin-oxide (ITO), tantalum pentoxide (Ta$_2$O$_5$), cerium oxide (CeO$_2$), yttrium oxide (Y$_2$O$_3$), europium oxide (Eu$_2$O$_3$), iron oxides such as (II)diiron(III) oxide (FeO$_4$) and ferric oxide (Fe$_2$O), hafnium nitride (HfN), hafnium carbide (HfC), hafnium oxide (HfO$_2$), lanthanum oxide (La$_2$O$_3$), magnesium oxide (MgO), neodymium oxide (Nd$_2$O$_3$), praseodymium oxide (Pr$_6$O$_{11}$), samarium oxide (Sm$_2$O$_3$), antimony trioxide (Sb$_2$O$_3$), silicon monoxide (SiO), selenium trioxide (Se$_2$O$_3$), tin oxide (SnO$_2$), tungsten trioxide (WO), combinations thereof, and the like.

Non-limiting examples of suitable low refractive index materials for the dielectric layer includes silicon dioxide (SiO$_2$), aluminum oxide (Al$_2$O$_3$), metal fluorides such as magnesium fluoride (MgF$_2$), aluminum fluoride (AlF$_3$), cerium fluoride (CeF$_3$), lanthanum fluoride (LaF$_3$), sodium aluminum fluorides (e.g., Na$_3$AlF$_6$, Na$_5$Al$_3$F$_{14}$), neodymium fluoride (NdF$_3$), samarium fluoride (SmF$_3$), barium fluoride (BaF$_2$), calcium fluoride (CaF$_2$), lithium fluoride (LiF), combinations thereof, or any other low index material having an index of refraction of about 1.65 or less. For example, organic monomers and polymers can be utilized as low index materials, including dienes or alkenes such as acrylates (e.g., methacrylate), perfluoroalkenes, polytetrafluoroethylene (Teflon), fluorinated ethylene propylene (FEP), combinations thereof, and the like.

The pigment can also include at least one absorber layer. The absorber layer can include any absorber material, including both selective absorbing materials and nonselective absorbing materials. For example, the absorber layer can be formed of nonselective absorbing metallic materials deposited to a thickness at which the absorber layer is at least partially absorbing, or semi-opaque. An example of a non-selective absorbing material can be a gray metal, such as chrome or nickel. An example of a selective absorbing material can be copper or gold. In an aspect, the absorbing material can be chromium. Non-limiting examples of suitable absorber materials include metallic absorbers such as chromium, aluminum, silver, nickel, palladium, platinum, titanium, vanadium, cobalt, iron, tin, tungsten, molybdenum, rhodium, niobium, carbon, graphite, silicon, geranium, cermet and various combinations, mixtures, compounds, or alloys of the above absorber materials that may be used to form the absorber layer.

Examples of suitable alloys of the above absorber materials can include Inconel (Ni—Cr—Fe), stainless steels, Hastalloys (Ni—Mo—Fe; Ni—Mo—Fe—Cr; Ni—Si—Cu) and titanium-based alloys, such as titanium mixed with carbon (Ti/C), titanium mixed with tungsten (Ti/W), titanium mixed with niobium (Ti/Nb), and titanium mixed with silicon (Ti/Si), and combinations thereof. Other examples of suitable compounds for the absorber layer include titanium-based compounds such as titanium silicide (TiSi$_2$), titanium boride (TiB$_2$), and combinations thereof. Alternatively, the absorber layer can be composed of a titanium-based alloy disposed in a matrix of Ti, or can be composed of Ti disposed in a matrix of a titanium-based alloy.

There is also disclosed a composition including the pigment having a magnetizable reflector layer including the intermetallic compound disclosed above, in which the pigment is dispersed in a liquid medium. There is also disclosed a composition including the pigment having a semi-transparent absorber layer including the intermetallic compound disclosed above, in which the pigment is dispersed in a liquid medium. Non-limiting examples of a liquid medium include polyvinyl alcohol, polyvinyl acetate polyvinylpyrrolidone, poly(ethoxyethylene), poly(methoxyethylene), poly(acrylic) acid, poly(acrylamide), poly(oxyethylene), poly(maleic anhydride), hydroxyethyl cellulose, cellulose acetate, poly(sacchrides) such as gum arabic and pectin, poly(acetals) such as polyvinylbutyral, poly(vinyl halides) such as polyvinyl chloride and polyvinylene chloride, poly(dienes) such as polybutadiene, poly(alkenes) such as polyethylene, poly(acrylates) such as polymethyl acrylate, poly(methacrylates) such as poly methylmethacrylate, poly(carbonates) such as poly(oxycarbonyl oxyhexamethylene), poly(esters) such as polyethylene terephthalate, poly(urethanes), poly(siloxanes), poly(sulphides), poly(sulphones), poly(vinylnitriles), poly(acrylonitriles), poly(styrene), poly(phenylenes) such as poly(2,5 dihydroxy-1,4-phenyleneethylene), poly(am ides), natural rubbers, formaldahyde resins, other polymers and mixtures of polymers and polymers with solvents.

The composition can be applied to a surface of a substrate to form a security device. The substrate can be made of a flexible material. The substrate can be any suitable material that can receive multiple layers deposited during the manufacturing process. Non-limiting examples of suitable substrate materials include polymer web, such as polyethylene terephthalate (PET), glass foil, glass sheets, polymeric foils, polymeric sheets, metal foils, metal sheets, ceramic foils, ceramic sheets, ionic liquid, paper, silicon wafers, etc. The substrate can vary in thickness, but can range for example from about 2 μm to about 100 μm, and as a further example from about 10 μm to about 50 μm.

EXAMPLES

Example 1—A pigment comprising a magnetizable reflector layer including an intermetallic compound, wherein the intermetallic compound is a crystal structure of at least two different elemental metals chemically bonded together was prepared. In particular, three thin-film three-layer structures were deposited onto a polyester substrate with a layer of an organic release on its surface: $MgF_2/R/MgF_2$, wherein R was Al, Fe, or $Fe_3Al$.

The structures were immersed into an organic solvent, and a release layer on the substrate was dissolved, leaving the structure floating in the solvent. The pigment was filtered, dried and ground to an average particle size of about 20 microns. The pigment was mixed with a liquid medium, such as a colorless organic resin, coated onto a paper card, dried, and analyzed.

Figure 5:
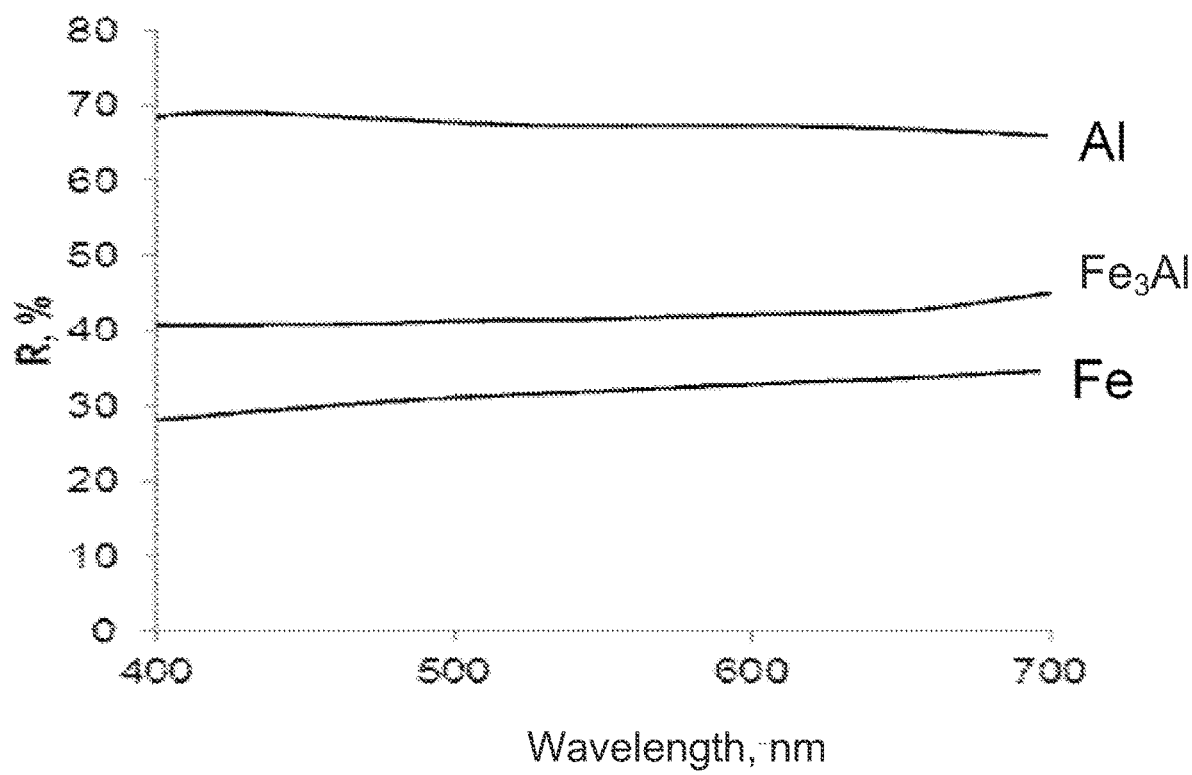
FIG. 5 is a graph of the spectral reflectance of a pigment according to an aspect of the invention, and two comparative pigments.

The content of aluminum in the thin-film binary intermetallic compound, found by elemental analysis, varied in the range from 12.5 wt. % to 15 wt. % at 13.87 wt. % of Al in stoichiometric $Fe_3Al$ (iron aluminide). The plot of the spectral reflectance of the pigment with the iron aluminide intermetallic is illustrated in FIG. 5 in comparison with pigments containing a pure aluminum reflector layer or a pure iron reflector layer.

Example 2—A pigment comprising a magnetizable reflector layer including an intermetallic compound, wherein the intermetallic compound is a crystal structure of at least two different elemental metals chemically bonded together was prepared. The pigment also included at least one dielectric layer. The pigment also included at least one absorber layer. Two other comparative pigments were prepared. The structures of the three pigments were as follows:
  $Cr/MgF_2/Al/MgF_2/Cr$;
  $Cr/MgF_2/Fe_3Al/MgF_2/Cr$;
  $Cr/MgF_2/Fe/MgF_2/Cr$.

Figure 6:
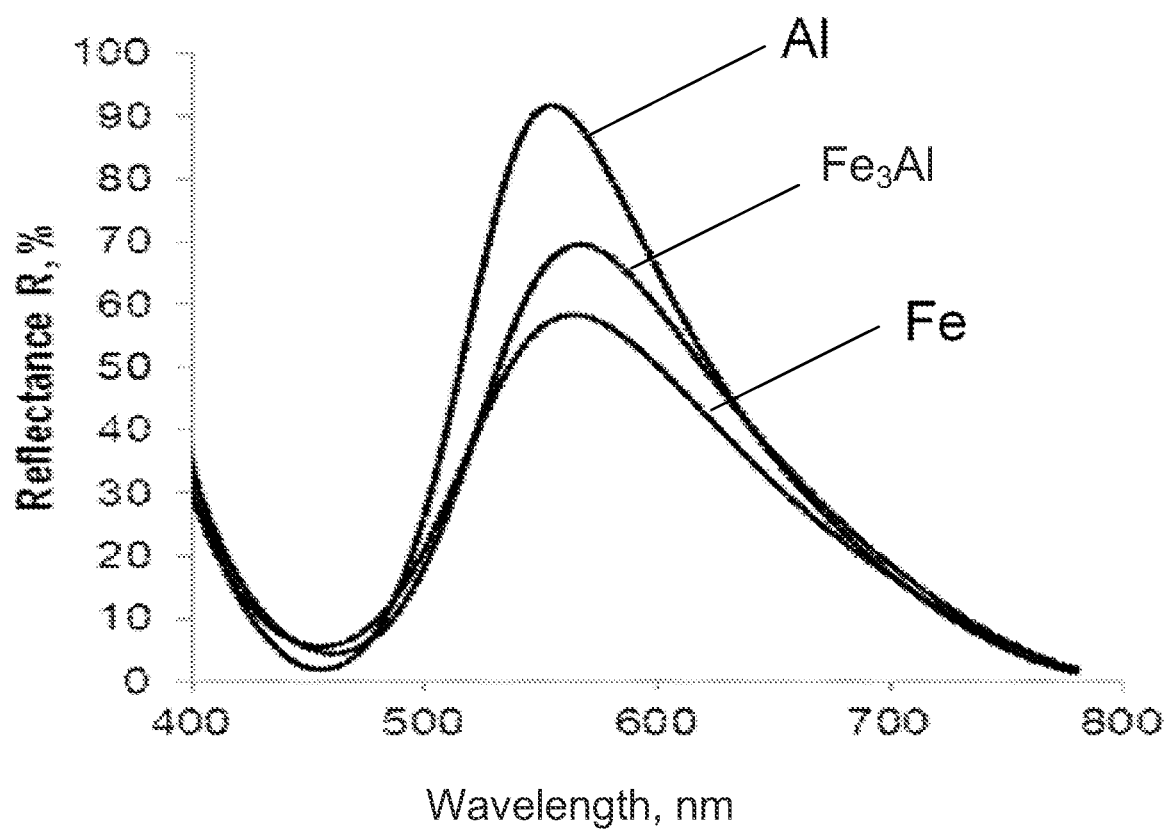
FIG. 6 is a graph of the spectral reflectance of a pigment according to another aspect of the invention, and two comparative pigments.

The structures were vacuum deposited onto polyester substrates, and post-processed as described above. The pigments were mixed with a liquid medium, such as a colorless organic binder, and coated on a flat paper card for analytical purposes. A spectral scan of these structures, as shown in FIG. 6, demonstrated that the peak of reflectance for the inventive pigment with the iron aluminide intermetallic in the magnetizable reflector layer was located at the acceptable level between the reflectance peaks of comparative pigments with a pure aluminum reflector layer or a pure iron reflector layer.

Example 3—A pigment comprising a semi-transparent absorber layer including an intermetallic compound, wherein the intermetallic compound is a crystal structure of at least two different elemental metals chemically bonded together was prepared. Comparative pigments were prepared with different absorbers. All of the pigments had the same symmetric structure as follows: $Me/MgF_2/Al/MgF_2/Me$, wherein Me is Cr, Ti, TiNi, or $Ti_2Ni$. Paint drawdowns were made for all of the pigments. The paint drawdowns were immersed for 24 hours in water and diluted solutions of acid, sodium hydroxide, and industrial bleach.

The transparency of the absorber in each pigment was 30% T. The color of the drawdowns was measured before and after their corrosion resistance test. The difference in the color performance was expressed with the Delta E in Table 2. Delta E in the CIE color system is the difference between two colors designated as two points in the Lab color space.

TABLE 2

Color Performance

| | Delta E Material of Absorber | | | |
|---|---|---|---|---|
| Environment | Cr | TiNi | $Ti_2Ni$ | Ti |
| Water | 19.22 | 13.13 | 19.5 | 23.87 |
| NaOH solution | 17.64 | 4.87 | N/A | 5.45 |
| Industrial Bleach | 3.42 | 3.5 | 1.71 | 6.43 |

As a general rule of thumb, a delta E of 1 is barely perceptible, and a delta E higher than 3 means two different colors. As follows from Table 2, the chemical resistance of pigments with titanium nickelade absorbers is better than the corrosion resistance of the pigments with chromium and titanium absorbers.

There is also disclosed a method of making a pigment, comprising: depositing, onto a substrate, a layer including an intermetallic compound by thermal evaporation in vacuum or co-evaporation, wherein the intermetallic compound is a crystal structure of at least two different elemental metals chemically bonded together.

The method can further include depositing at least one additional layer chosen from a reflector layer, a dielectric layer, and an absorber layer between the substrate and the layer including the intermetallic compound. The deposited layers can result in a structure of: absorber/dielectric/magnetizable reflector layer including an intermetallic compound/dielectric/absorber. In another aspect, the deposited layer can result in a structure of semi-transparent absorber layer including an intermetallic compound/dielectric/reflector/dielectric/semi-transparent absorber layer including an intermetallic compound. In another aspect, the deposited layer can result in a structure of: structure of semi-transparent absorber layer including an intermetallic compound/dielectric magnetizable reflector layer including an intermetallic compound/dielectric/semi-transparent absorber layer including an intermetallic compound.

The layer including an intermetallic compound can be a semi-transparent absorber layer and has increased durability as compared to an absorber layer that does not include the intermetallic compound.

The layer including an intermetallic compound can be a magnetizable reflector layer and can be corrosion resistant as compared to a reflector layer that does not include the intermetallic compound.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications can be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use and operation, this disclosure is intended to encompass the equivalents, means, systems and methods of the use of the device and/or optical device of manufacture and its many aspects consistent with the description and spirit of the operations and functions disclosed herein. The claims of this application are likewise to be broadly construed. The description of the inventions herein in their many embodiments is merely exemplary in nature and, thus, variations that do not depart from the gist of the invention are intended to be within the scope of the invention. Such variations are not to be regarded as a departure from the spirit and scope of the invention.

What is claimed is:

1. A pigment, comprising:
    a magnetizable reflector layer including an intermetallic compound, wherein the intermetallic compound is a crystal structure of at least two different elemental metals chemically bonded together,
    wherein the intermetallic compound is selected from the group consisting of $CoAs_2$, NiSb, ZrNi, $Zr_2Ni$, $Zr_3Fe$, TbAl, $Tb_2Al$, $Fe_xSi_yAl_z$ (x=85%, y=9%, z=6%), $Tb_xDy_{1-x}Fe_2$ (x~0.3), AlGd, $AlGd_2$, TbPtGa, $La_2Co_{17-x}Ta_x$ in which x is 0.5 or 0.6, $HoCo_2B_2C$, $GdNi_2B_2C$, $ErCo_2B_2C$, and $(Y_{1-x}Gd_x)Ni_2B_2C$; and
    wherein the pigment has a structure of: first absorber layer/dielectric layer/the magnetizable reflector layer including an intermetallic compound/dielectric layer/second absorber layer.

2. The pigment of claim 1, wherein the intermetallic compound is selected from the group consisting of $CoAs_2$, NiSb, ZrNi, $Zr_2Ni$, $Zr_3Fe$, $Tb_xDy_{1-x}Fe_2$ (x~0.3), $La_2Co_{17-x}Ta_x$ in which x is 0.5 or 0.6, $HoCo_2B_2C$, $GdNi_2B_2C$, $ErCo_2B_2C$, and $(Y_{1-x}Gd_x)Ni_2B_2C$.

3. The pigment of claim 1, wherein the intermetallic compound is a compound chosen from TbPtGa, and $La_2Co_{17-x}Ta_x$, where x=0.5 or 0.6.

4. The pigment of claim 1, wherein the intermetallic compound is a compound chosen from $HoCo_2B_2C$, $GdNi_2B_2C$, and $ErCo_2B_2C$.

5. The pigment of claim 1, wherein the intermetallic compound is $(Y_{1-x}Gd_x)Ni_2B_2C$.

6. The pigment of claim 1, further comprising, at least one dielectric layer.

7. The pigment of claim 1, further comprising, at least one absorber layer.

8. The pigment of claim 1, wherein the first absorber layer is a semi-transparent absorber layer including an intermetallic compound and wherein the second absorber layer is a semi-transparent absorber layer including an intermetallic compound.

9. A composition comprising the pigment of claim 1 dispersed in a liquid medium.

10. A pigment, comprising:
    a semi-transparent absorber layer including an intermetallic compound, wherein the intermetallic compound is a crystal structure of at least two different elemental metals chemically bonded together;
    wherein the intermetallic compound is selected from the group consisting of $CoAs_2$, NiSb, $Cu_3As$, ZrNi, $Zr_2Ni$, $Zr_3Fe$, TiZn, $Ti_2Zn$, $TiZn_2$, TbAl, $Tb_2Al$, $Tb_xDy_{1-x}Fe_2$ (x~0.3), TbPtGa, $La_2Co_{17-x}Ta_x$ in which x is 0.5 or 0.6, $HoCo_2B_2C$, $GdNi_2B_2C$, $ErCo_2B_2C$, and $(Y_{1-x}Gd_x)Ni_2B_2C$,
    wherein the pigment has a structure of: semi-transparent absorber layer including an intermetallic compound/dielectric layer/reflector layer/dielectric layer/semi-transparent absorber layer including an intermetallic compound.

11. The pigment of claim 10, wherein the intermetallic compound is selected from the group consisting of $CoAs_2$, NiSb, $Cu_3As$, ZrNi, $Zr_2Ni$, $Zr_3Fe$, TiZn, $Ti_2Zn$, $TiZn_2$, TbAl, $Tb_2Al$, $Tb_xDy_{1-x}Fe_2$ (x~0.3), $La_2Co_{17-x}Ta_x$ in which x is 0.5 or 0.6, $HoCo_2B_2C$, $GdNi_2B_2C$, $ErCo_2B_2C$, and $(Y_{1-x}Gd_x)Ni_2B_2C$.

12. The pigment of claim 10, wherein the intermetallic compound is a two-component binary intermetallic compound chosen from any of the two-component compounds recited in claim 10.

13. A composition comprising the pigment of claim 10 dispersed in a liquid medium.

* * * * *